United States Patent [19]

Lust

[11] Patent Number: 5,548,208
[45] Date of Patent: Aug. 20, 1996

[54] TERMINAL FOR CONNECTING LIVE CONDUCTORS

[75] Inventor: Karl-Heinz Lust, Lahnau-Waldgirmes, Germany

[73] Assignee: Lust Antriebstechnik GmbH, Lahnau, Germany

[21] Appl. No.: 360,656

[22] PCT Filed: Apr. 12, 1994

[86] PCT No.: PCT/EP94/01084

§ 371 Date: Dec. 19, 1994

§ 102(e) Date: Dec. 19, 1994

[87] PCT Pub. No.: WO94/24574

PCT Pub. Date: Oct. 27, 1994

[30] Foreign Application Priority Data

Apr. 20, 1993 [DE] Germany ............................ 43 12 760.6

[51] Int. Cl.⁶ .............................. G01R 1/04; G01R 1/22; G01R 33/00
[52] U.S. Cl. ........................................ 324/117 H; 324/127
[58] Field of Search .................................... 324/127, 142, 324/117 H, 117 R, 102, 244, 259, 260; 336/84 C, 176

[56] References Cited

U.S. PATENT DOCUMENTS

| 4,378,525 | 3/1983 | Burdick | 329/127 |
| 4,656,418 | 4/1987 | Boston et al. | 324/127 |
| 5,451,865 | 9/1995 | Coburn | 324/127 |

FOREIGN PATENT DOCUMENTS

| 2739632 | 11/1980 | Germany . |
| 8400275.1 | 5/1984 | Germany . |
| 3426785 | 1/1986 | Germany . |
| 3828005 | 3/1989 | Germany . |
| 3783704 | 8/1993 | Germany . |
| 4300605 | 7/1994 | Germany . |
| 0237461 | 9/1989 | Japan . |
| 1569735 | 9/1995 | U.S.S.R. . |

*Primary Examiner*—Kenneth A. Wieder
*Assistant Examiner*—Barry C. Bowser
*Attorney, Agent, or Firm*—Flynn, Thiel, Boutell & Tanis, P.C.

[57] ABSTRACT

For potential-free d.c. and a.c. measurement, a terminal for connecting live conductors with at least two clamping components for the electrical conductors and a connecting member securing the clamping components together has one or more magnet field sensors arranged at a predetermined distance from the connecting member securing the clamping components of the electrical conductors together.

15 Claims, 1 Drawing Sheet

TERMINAL FOR CONNECTING LIVE CONDUCTORS

FIELD OF THE INVENTION

The invention relates to a terminal for connecting live conductors comprising at least two clamping components for clamping the electrical conductors and one connecting member for connecting the two clamping components with one another.

BACKGROUND OF THE INVENTION

The potential-free detection of direct currents and alternating currents is realized according to the state of the art by current sensors which are based on the compensation of magnetic fields guided in a soft-magnetic core, which magnetic fields are detected by Hall elements.

Newer developments utilize magnetoresistive sensors for detecting the magnetic field. Magnet sensors of the above-mentioned type are described, for example, in DE-43 00 605.1.

SUMMARY OF THE INVENTION

The basic purpose of the invention is to provide a device for detecting magnetic fields, which is simple in its design and can be arranged in a simple manner near the connecting terminals of the device.

According to the invention, the purpose is attained by the terminal having one or several magnetic-field sensors at a specific distance relative to a connecting member, where the connecting member electrically connects the clamping components and thereby the electrical conductors with one another.

The connecting terminal, which as a rule is arranged near the devices has, according to the invention, one or more magnetic-field sensors. These magnetic-field sensors are arranged at a specific distance from the connecting member which electrically connects the two conductors being connected with one another. A potential-free detection of input and output currents of the device and of a connecting element disposed between the internal device wiring and the application-specific external wiring is herewith created.

The magnetic-field sensor of sensors preferably are secured on an insulator, which in turn is fixed on the connecting member. A defined arrangement of the magnetic-field sensor relative to the currents flowing in the connecting member is herewith created so that an exact potential-free detection of the direct currents and the alternating currents is guaranteed.

According to a further development of the invention, an evaluating circuit is provided in the terminal in addition to the magnetic-field sensor. The terminals can be manufactured with outside dimensions being in standard form so that they can be fastened in a conventional manner on rails and in particular, on double-T rails.

A significant reduction in the costs of the structural parts, a significantly reduced installation expense, an improvement in operating safety by reducing the number of contact points, a significant reduction in size, and a reduction in the influence on the measuring signals by coupling in foreign fields is achieved with a terminal of the invention.

BRIEF DESCRIPTION OF THE DRAWINGS

One preferred embodiment of the invention will be described in greater detail hereinafter in connection with the drawings, in which.

DETAILED DESCRIPTION

Figure 1:
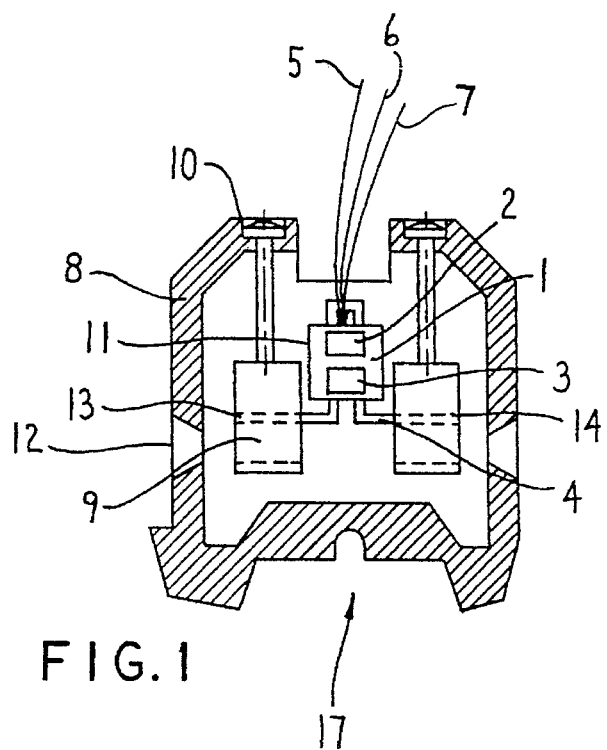
FIG. 1 is a cross-sectional view taken along the line II—II of FIG. 2 of a terminal designed according to the invention.
Figure 2:
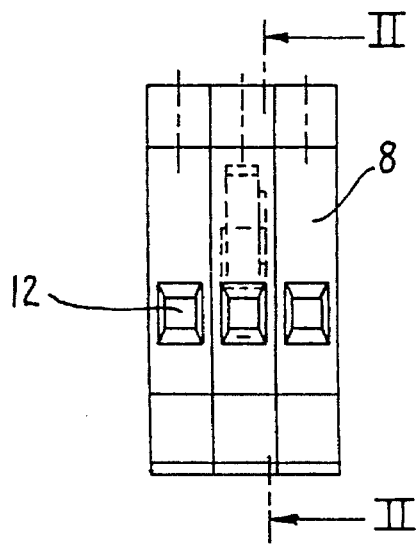
FIG. 2 is a side view of several terminals, which are arranged side-by-side.

The terminal of the invention as illustrated in FIGS. 1 and 2 includes a housing 8 having openings 12 in its front side through which the electrical conductors that are to be connected thereto are moved into the housing B.

Figures 3, 4:
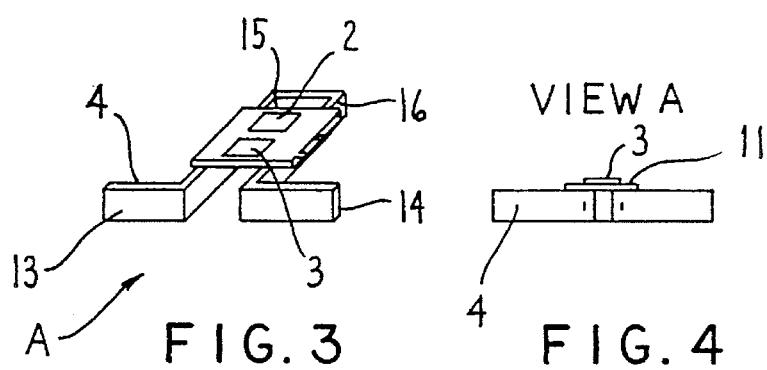
FIG. 3 is a perspective view of a connecting member between the connecting contacts of the terminal.
FIG. 4 is a plan view in the direction of the arrow A in FIG. 3.

The clamping components 9 are for fastening the electrical conductors and are arranged in a conventional manner inside of the housing, with screws 10 being used for clamping the conductors in the clamping components 9. The two clamping components 9 are connected together through a connecting member 4, which is illustrated in detail in FIGS. 3 and 4. The connecting member 4 is bent so as to be U-shaped and is fastened with its two ends 13, 14 in the clamping components 9. An insulator 11 is fastened on the two legs 15, 16 of the connecting member 4 wherein a hybrid circuit 1 is integrated in the insulator 11 for the sensor chip 2 and the evaluating circuit 3.

The sensor chip and the evaluating circuit are supplied with voltage through lines 5, 6 and 7 and discharge the measured data through said lines.

The housing 8 of a terminal designed according to the invention can be moved with its base 17 positioned onto a U-rail or a double-T rail so that, as shown in FIG. 2, several terminals are arranged side-by-side. It is advantageous for certain uses that the connecting members 4 of these terminals be constructed with definite, however, different resistors.

Thus, it is of interest when using the invention for a voltage measurement to load the viewed voltage source with as high a resistance as possible in order to determine retroactively the voltage from the then flowing current.

Additions may be provided, for example, with respect to a performance measurement which requires a simultaneous detection of applied voltage and received current so that for this operational ready two terminals are to be arranged preferably one next to the other.

The embodiments of the invention in which an exclusive property or privilege is claimed are defined as follows:

1. A test terminal for monitoring the signal through a conductor separated into two sections, said terminal comprising two clamping components for mechanically holding adjacent ends of the conductor sections, a connecting member connecting said two clamping components with one another so that the signal through the conductor-under-test flows through said connecting member, and at least one magnetic-field sensor positioned at a specified distance relative to said connecting member, said magnetic-field sensor configured to generate an output signal as a function of the signal through said connecting member.

2. The test terminal according to claim 1, wherein being at least one insulator is arranged between said connecting member and said magnetic-field sensor.

3. The test terminal according to claim 2, wherein said at least one insulator, said magnetic-field sensors and said connecting member are physically connected with one another.

4. The test terminal according to claim 1, wherein an evaluating circuit is provided in the terminal in addition to said magnetic-field sensor.

5. The terminal according to claim 4, wherein a hybrid circuit containing said magnetic-field sensor and said evaluating circuit is seated on said at least one insulator.

6. The terminal according to claim 1, wherein the terminal is designed as a standard terminal.

7. The terminal according to claim 1, wherein the terminal further includes a housing, said housing being formed with at least one cut dimensioned to allow said housing to be secured to a complementary member.

8. The terminal according to claim 1, wherein said connecting member has a defined resistance.

9. The terminal according to claim 1, wherein a plurality of terminals are arranged in a housing.

10. The terminal according to claim 9, wherein said connecting pieces of said plurality of terminals have different resistances.

11. The test terminal of claim 1, wherein said connecting member has a defined resistance and said sensor is configured to generate an output signal representative of current flow through said connecting member.

12. A test terminal for monitoring the signal through separate ends of a separated conductor, said terminal comprising:

a housing;

first and second conductive clamping assemblies disposed in said housing, each said clamping assembly being configured to releasably secure thereto a separate one of the conductor ends;

a conductive connecting member within said housing and being connected between said first and second conductive clamping assemblies;

a sensor disposed in said housing so as to be adjacent to and spaced from said connective member and being configured to sense the magnetic field of a signal flowing through said conductive connecting member, and as a function thereof to generate a sensor signal; and at least two output terminals connected to said sensor for outputting said sensor signal, said at least two output terminals being externally accessible from the housing.

13. The test terminal of claim 12, wherein openings on opposing sides of said housing receive separate ends of conductors.

14. The test terminal of claim 12, wherein each said clamping assembly includes a clamping member shaped to receive the conductor end and a fastening member adjustably coupled to said clamping member for securing the conductor end to said clamping member, said fastening member being further configured to extend outside of said housing so that said fastening member can be adjustably set.

15. The test terminal of claim 12, wherein said connecting member has a defined resistance and said sensor is configured to generate said sensor signal so that said sensor signal is representative of current flow through said connecting member.

* * * * *

UNITED STATES PATENT AND TRADEMARK OFFICE
CERTIFICATE OF CORRECTION

PATENT NO. : 5 548 208
DATED : August 20, 1996
INVENTOR(S) : Karl-Heinz LUST

It is certified that error appears in the above-indentified patent and that said Letters Patent is hereby corrected as shown below:

```
Column 2, line 65; after "sensor" insert ---being---.
          line 67; delete "being".
Column 3, line 24; change "pieces" to ---members---.
Column 4, line  9; change "connective" to
                   ---connecting---.
          line 19; change "conductors" to
                   ---conductor---.
          line 22; change "the" to ---a---.
```

Signed and Sealed this

Twenty-second Day of April, 1997

Attest:

BRUCE LEHMAN

*Attesting Officer*

Commissioner of Patents and Trademarks